(12) United States Patent
Tanaka (10) Patent No.: US 9,640,460 B2
(45) Date of Patent: May 2, 2017

(54) SEMICONDUCTOR DEVICE WITH A HEAT-DISSIPATING PLATE

(71) Applicant: Panasonic Intellectual Property Management Co., Ltd., Osaka-shi, Osaka (JP)

(72) Inventor: Zyunya Tanaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 33 days.

(21) Appl. No.: 14/762,713

(22) PCT Filed: Feb. 3, 2014

(86) PCT No.: PCT/JP2014/000540
§ 371 (c)(1),
(2) Date: Jul. 22, 2015

(87) PCT Pub. No.: WO2014/122908
PCT Pub. Date: Aug. 14, 2014

(65) Prior Publication Data
US 2015/0371921 A1      Dec. 24, 2015

(30) Foreign Application Priority Data

Feb. 5, 2013  (JP) ................................. 2013-020003

(51) Int. Cl.
*H01L 23/34*   (2006.01)
*H01L 23/10*   (2006.01)
(Continued)

(52) U.S. Cl.
CPC ........ *H01L 23/3675* (2013.01); *H01L 21/565* (2013.01); *H01L 23/3107* (2013.01);
(Continued)

(58) Field of Classification Search
CPC ............. H01L 23/3675; H01L 23/3107; H01L 23/49541; H01L 24/83; H01L 23/4952;
(Continued)

(56) References Cited

U.S. PATENT DOCUMENTS 5,698,899 A   12/1997  Hirakawa et al.
5,703,399 A   12/1997  Majumdar et al.
(Continued)

FOREIGN PATENT DOCUMENTS

CN      1118434      3/1996
CN      102315135    1/2012
(Continued)

OTHER PUBLICATIONS

Office Action issued in corresponding Chinese Patent Application No. 201280071107.4 on Dec. 14, 2015 (6 pages).
(Continued)

*Primary Examiner* — Kimberly Rizkallah
*Assistant Examiner* — Dilinh Nguyen
(74) *Attorney, Agent, or Firm* — Hamre, Schumann, Mueller and Larson, P.C.

(57) ABSTRACT

A semiconductor device of the present invention includes: a first substrate (1) on which a power semiconductor element (2) is mounted; a heat-dissipating plate (12); an insulating layer (11) disposed between the first substrate (1) and the heat-dissipating plate (12); and molding resin (4) that molds the first substrate (1), the heat-dissipating plate (12), and the insulating layer (11). The heat-dissipating plate (12) has a first surface opposite to the insulating layer (12), the first surface being exposed from the molding resin (4). The insulating layer (11) has a curved area (11*a*) that is curved to the first surface and an end that is located in the molding resin (4).

10 Claims, 6 Drawing Sheets

(51) Int. Cl.
*H01L 23/495* (2006.01)
*H01L 23/367* (2006.01)
*H01L 21/56* (2006.01)
*H01L 23/433* (2006.01)
*H01L 23/31* (2006.01)
*H01L 23/00* (2006.01)

(52) U.S. Cl.
CPC ...... *H01L 23/4334* (2013.01); *H01L 23/4952* (2013.01); *H01L 23/49541* (2013.01); *H01L 23/49575* (2013.01); *H01L 24/32* (2013.01); *H01L 24/83* (2013.01); *H01L 24/29* (2013.01); *H01L 24/45* (2013.01); *H01L 24/48* (2013.01); *H01L 24/49* (2013.01); *H01L 24/73* (2013.01); *H01L 24/85* (2013.01); *H01L 2224/0603* (2013.01); *H01L 2224/29111* (2013.01); *H01L 2224/32245* (2013.01); *H01L 2224/45124* (2013.01); *H01L 2224/48137* (2013.01); *H01L 2224/48139* (2013.01); *H01L 2224/48247* (2013.01); *H01L 2224/49111* (2013.01); *H01L 2224/49175* (2013.01); *H01L 2224/73265* (2013.01); *H01L 2224/85205* (2013.01); *H01L 2924/1305* (2013.01); *H01L 2924/13055* (2013.01); *H01L 2924/13091* (2013.01); *H01L 2924/181* (2013.01)

(58) Field of Classification Search
CPC ........... H01L 23/4334; H01L 23/49575; H01L 24/32; H01L 21/565; H01L 2224/49111; H01L 2224/0603; H01L 2924/181; H01L 2224/48139; H01L 2924/1305; H01L 2924/13091; H01L 2224/29111; H01L 2224/32245; H01L 24/49; H01L 2224/85205; H01L 24/48; H01L 2224/48247; H01L 2224/73265; H01L 2224/49175; H01L 2224/48137; H01L 2023/4018; H01L 2023/4025; H01L 2023/4031; H01L 2023/4037; H01L 2023/4043; H01L 2023/405; H01L 2023/4056; H01L 2023/4062; H01L 2023/4068; H01L 2023/4075; H01L 2023/4081; H01L 2023/4087; H01L 23/34; H01L 23/36; H01L 23/367
USPC .......................... 257/712, 787, 773, 675, 706
See application file for complete search history.

(56) References Cited

U.S. PATENT DOCUMENTS

| | | | | |
|---|---|---|---|---|
| 6,166,433 | A * | 12/2000 | Takashima | H01L 21/563 257/693 |
| 7,944,045 | B2 | 5/2011 | Noritake et al. | |
| 8,247,891 | B2 * | 8/2012 | Wen | H01L 23/3735 257/675 |
| 2003/0057573 | A1 * | 3/2003 | Sekine | H01L 23/3107 257/787 |

FOREIGN PATENT DOCUMENTS

| | | |
|---|---|---|
| EP | 0 683 093 B1 | 10/1999 |
| JP | 10-125826 | 5/1998 |
| JP | 2003-100986 A | 4/2003 |
| JP | 2005-123219 | 5/2005 |
| JP | 2006-310556 | 11/2006 |
| JP | 4146785 B | 9/2008 |
| JP | 2009-194327 | 8/2009 |
| JP | 2011-009410 | 1/2011 |
| JP | 4732789 B | 7/2011 |

OTHER PUBLICATIONS

Extended European Search Report issued in corresponding European Patent Application No. 14748506.4, Jan. 26, 2016 (6 pages).
International Search Report, May 13, 2014; PCT/JP2014/000540.
Office Action issued in corresponding Japanese Patent Application No. 2014-560675 on Mar. 18, 2016.
Office Action for Chinese Patent Application No. 201480002586.3 dated Dec. 14, 2016 (7 pages).

* cited by examiner

SEMICONDUCTOR DEVICE WITH A HEAT-DISSIPATING PLATE

TECHNICAL FIELD

The present invention relates to a semiconductor device and a method for manufacturing the same. The present invention relates to, in particular, a semiconductor device that includes a power device for a switching element and so on and is used for power conversion of inverters and so on.

BACKGROUND ART

A power device, a kind of semiconductor device, is used for a power conditioner of a photovoltaic power generation system and motor rotation control of home appliances or EVs (Electric Vehicles). Such power devices are one-packaged in an increasing number of products in order to reduce a footprint, improve performance with a shortened distance between semiconductor elements, or reduce a design load for users. One-packaging refers to housing and modularizing a plurality of power devices in a single package. A one-packaged product is called a power module.

A resin-molding power module is assembled by, for example, transfer molding.

Figure 5:
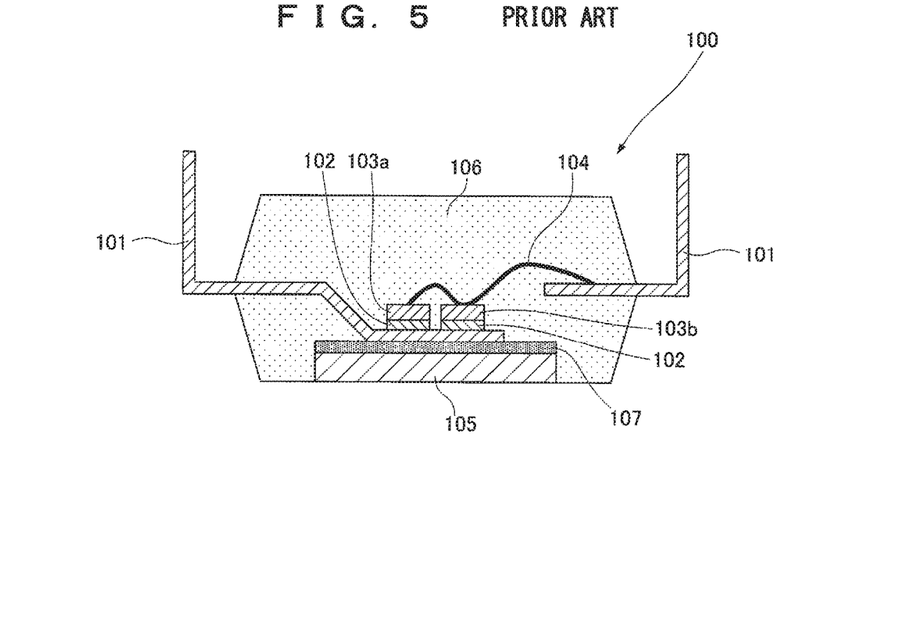
FIG. 5 is a cross-sectional schematic diagram showing a conventional semiconductor device.

For example, a semiconductor device according to transfer molding is disclosed in Patent Literature 1. FIG. 5 is a cross-sectional schematic diagram showing a conventional semiconductor device 100 relating to Patent Literature 1.

In the semiconductor device 100 of FIG. 5, two power semiconductor elements 103a and 103b are bonded onto a lead frame 101 with a bonding material 102.

The power semiconductor element 103b and the other power semiconductor element 103a or the lead frame 101 are electrically connected to each other via, a bonding wire 104 made of, for example, Al. The semiconductor device 100 further includes a heat-dissipating plate 105 exposed from molding resin 106.

For electrical insulation between the lead frame 101 that carries a current and the heat-dissipating plate 105, an insulating layer 107 is formed between the lead frame 101 and the heat-dissipating plate 105. The insulating layer 107 is an epoxy-resin insulating sheet containing a ceramic filler.

For example, a home power conditioner requires a dielectric voltage of 2.5 KV between the lead frame 101 and the heat-dissipating plate 105. In this case, the thickness of the insulating layer 107 is set at, for example, 0.15 mm to 0.3 mm.

Moreover, the semiconductor device 100 needs to be reduced in size. Thus, the proposed smaller semiconductor device 100 includes the lead frame 101 and the heat-dissipating plate 105 that are substantially identical in size. However, if the lead frame 101 and the heat-dissipating plate 105 have the same size, an air layer 108 (see FIGS. 6(a) and 6(b)) in the molding resin 106 may deteriorate the dielectric voltage.

This point will be described below in accordance with FIGS. 6(a) and 6(b).

Figure 6A:
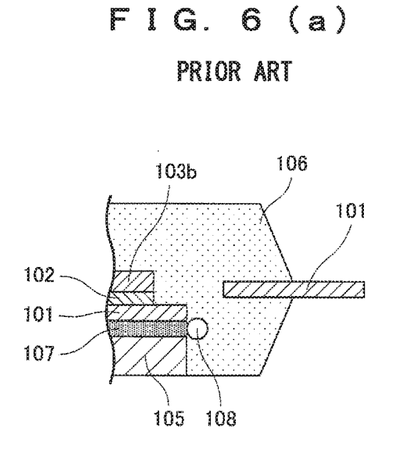
FIG. 6(a) is a cross-sectional schematic diagram showing a semiconductor device of Patent Literature 1 in which a lead frame and a heat-dissipating plate are identical in size and FIG. 6(b) is a cross-sectional schematic diagram showing the semiconductor device in which a heat-dissipating plate is larger than a lead frame.
Figure 6B:
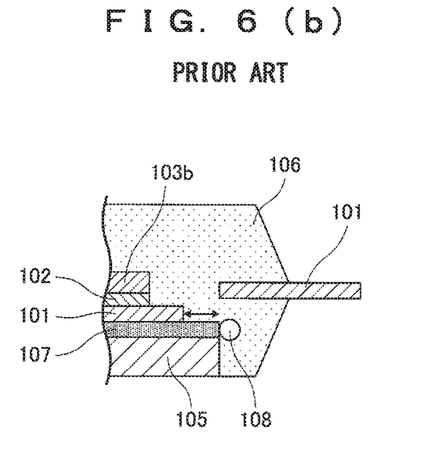

FIGS. 6(a) and 6(b) show internal cross-sectional views of the semiconductor device and cross-sectional schematic diagrams of the positional relationship among the lead frame 101, the heat-dissipating plate 105, and the insulating layer 107. In FIG. 6(a), the lead frame 101 and the heat-dissipating plate 105 have the same size. In FIG. 6(b), the heat-dissipating plate 105 is larger than the lead frame 101. FIG. 6(a) shows that the air layer 108 is located near the edge of the heat-dissipating plate 105. The air layer 108 is, for example, a void or the like that is caused by a resin flow in a molding step. It is quite difficult to control the position and size of the void and thus as shown in FIG. 6(a), the edge of the lead frame 101 and the edge of the heat-dissipating plate 105 may be connected to each other via the air layer 108. Since the dielectric voltage of air is about 3 KV/mm, the application of a voltage of 2.5 KV may cause a dielectric breakdown at the position of the air layer 108 so as to pass a current from the lead frame 101 to the heat-dissipating plate 105. The heat-dissipating plate 105 in use is typically attached to an Al heat sink and so on. In the event of a dielectric breakdown, a current may pass through the Al heat sink.

In the semiconductor device 101 of Patent Literature 1, as shown in FIG. 6(b), the edges of the lead frame 101 and the heat-dissipating plate 105 are separated from each other, obtaining insulation reliability with a physical distance even in the presence of the air layer 108.

Figure 7:
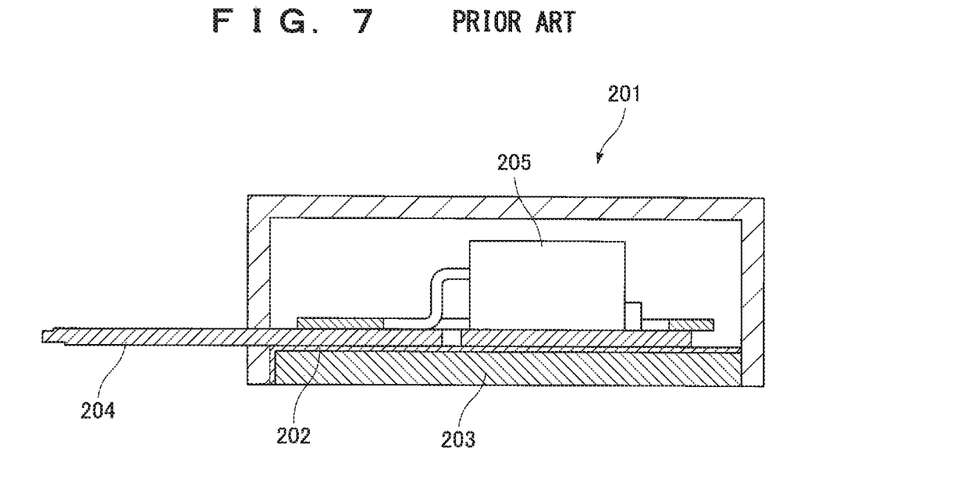
FIG. 7 is a cross-sectional schematic diagram showing a semiconductor device of Patent Literature 2.

As shown in FIG. 7, Patent Literature 2 discloses a semiconductor device 201 including a heat-dissipating plate 203 coated with an insulating coating 202 and a connecting terminal 204 on which a device 205 is disposed. The heat-dissipating plate 203 is connected to the connecting terminal 204. In the semiconductor device 201 of Patent Literature 2, the edge of the heat-dissipating plate 203 is coated with the insulating coating 202. Thus, insulation reliability can be obtained even in the presence of the air layer 108.

CITATION LIST

Patent Literature

Patent Literature 1: Japanese Patent No. 4146785
Patent Literature 2: Japanese Patent No. 4732789

SUMMARY OF INVENTION

Technical Problem

In the configuration of Patent Literature 1, however, the heat-dissipating plate 105 always needs to be larger than the lead frame 101, leading to difficulty in reducing the size of the semiconductor device 100. In the configuration of Patent Literature 2, the heat-dissipating plate 203 needs to be coated with the insulating coating 202 beforehand. This may lead to difficulty in manufacturing the semiconductor device 201.

The present invention has been devised in view of these problems. An object of the present invention is to provide a semiconductor device that can be easily manufactured with a smaller size.

Solution to Problem

A semiconductor device of the present invention includes: a first substrate on which a semiconductor element is mounted; a heat-dissipating plate; an insulating layer disposed between the first substrate and the heat-dissipating plate; and molding resin that molds the first substrate, the heat-dissipating plate, and the insulating layer, the heat-dissipating plate having a first surface opposite to the insulating layer, the first surface being exposed from the molding resin, the insulating layer having a curved area that is curved to the first surface and an end that is located in the molding resin.

A method for manufacturing a semiconductor device of the present invention, includes: disposing a first substrate on which a semiconductor element is mounted, an insulating layer, and a heat-dissipating plate in a mold such that the curved area of the insulating layer is placed out of the heat-dissipating plate; injecting molding resin into the mold; and curing the molding resin such that the curved area of the insulating layer is curved to a first surface opposite to the insulating layer of the heat-dissipating plate.

Advantageous Effect of Invention

A semiconductor device of the present invention can be easily manufactured with a smaller size.

DESCRIPTION OF EMBODIMENTS

Referring to FIGS. 1(a) and 1(b) to 4, embodiments of the present invention will be described below.

The embodiments of the specification will discuss a two-in-one (2 in 1) module. The two-in-one module is a module containing two transistors corresponding to one arm serving as the basic constitutional unit of an inverter.

First Embodiment

FIG. 1(a) is an internal plan view of a semiconductor device according to a first embodiment of the present invention. FIG. 1(b) is an internal cross-sectional view of FIG. 1(a). The semiconductor device is, for example, a power module. A plurality of power semiconductor elements are mounted in a power module. The power semiconductor element is an example of a semiconductor element, for example, an IGBT (Insulated Gate Bipolar Transistor) or a MOSFET (Metal-Oxide-Semiconductor Field Effect Transistor) for switching.

A plurality of power semiconductor elements 2 are mounted on lead frames 1 of the semiconductor device via a bonding material 10 according to the first embodiment. The lead frame 1 is an example of a first substrate. The lead frame 1 is made of, for example, Cu or a Cu alloy. The bonding material 10 is, for example, Sn—Ag—Cu solder in view of heat dissipation. In the semiconductor device of the first embodiment, the power semiconductor elements 2 are composed of two IGBTs 2a and two FWDs (Free Wheeling Diodes) 2b. The electrodes of the lead frame 1, the IGBT 2a, and the FWD 2b are connected via bonding wires 3 (3a, 3b). The bonding wire 3a connecting the IGBT 2a and the FWD 2b is, for example, an aluminum wire having a diameter of about 400 μm. Ordinarily, the surface electrode of the IGBT 2a acts as an emitter while the surface electrode of the FWD 2b acts as an anode. This connects the IGBT 2a and the FWD 2b in anti-parallel. At this point, the collector of the IGBT 2a and the cathode of the FWD 2b each correspond to a backside electrode. Furthermore, a gate electrode is provided on the surface of the IGBT 2a in addition to the emitter. The gate electrode and the lead frame 1 are connected via the bonding wire 3b. The bonding wire 3b is, for example, an aluminum wire having a diameter of about 150 μm because a current used for driving a gate is extremely smaller than that of a power line. Moreover, the lead frames 1, the power semiconductor elements 2, and the bonding wires 3 are covered with molding resin 4 in the semiconductor device of the first embodiment. Unlike this configuration, a positive-side power terminal 5, a negative-side power terminal 6, an output-side power terminal 7, positive-side control terminals 8, and negative-side control terminals 9 are exposed from the molding resin 4 so as to be connected to the outside. The molding resin 4 is made of, for example, an epoxy resin suitable for transfer molding.

Under the lead frame 1, a heat-dissipating plate 12 is disposed via an insulating layer 11. The insulating layer 11 may be, for example, an insulating sheet. The heat-dissipating plate 12 is an example of a second substrate. The insulating layer 11 is formed by mixing an epoxy resin having insulating and bonding properties and a ceramic filler for heat conduction. The ceramic filler containing, for example, BN (boron nitride) is preferable in terms of heat conduction because the ceramic filler has higher heat conductivity than materials such as alumina. Like the lead frame 1, the heat-dissipating plate 12 is made of, for example, Cu or a Cu alloy. The heat-dissipating plate 12 containing a smaller amount of impurity is preferable for obtaining higher heat conductivity. The heat-dissipating plate 12 is exposed (first surface) from the molding resin 4 opposite to the insulating layer 11 bonded on a surface of the heat-dissipating plate 12.

As shown in FIG. 1(a), a feature of the semiconductor device according to the first embodiment is that curved areas 11a of the insulating layer 11 face predetermined two sides of the insulating layer 11. The predetermined two sides have a clearance from the lead frame 1 on the rectangular heat-dissipating plate 12 and are illustrated as two right and left sides of the heat-dissipating plate 12 in FIG. 1(a). As will be specifically described later, the curved areas 11a of the insulating layer 11 are disposed so as to face the predetermined two sides in the semiconductor device of the first embodiment. This can reduce the possibility of a dielectric breakdown.

As shown in FIG. 1(a), in the semiconductor device of the first embodiment, a hole 15a is formed on the proximal end of the positive-side power terminal 5 while a hole 15b is formed on the proximal end of the output-side power terminal 7. The proximal end of the positive-side power terminal 5 is drawn from the lead frame 1 of the positive-side power terminal 5. The proximal end of the output-side power terminal 7 is drawn from the lead frame 1 of the output-side power terminal 7.

The proximal end of the positive-side power terminal 5 and the proximal end of the output-side power terminal 7 are larger in width than the distal end of the positive-side power terminal 5 and the distal end of the output-side power terminal 7 such that the formation of the holes 15a and 15b allows a current passage to have a sufficient cross-sectional area.

Figure 1:
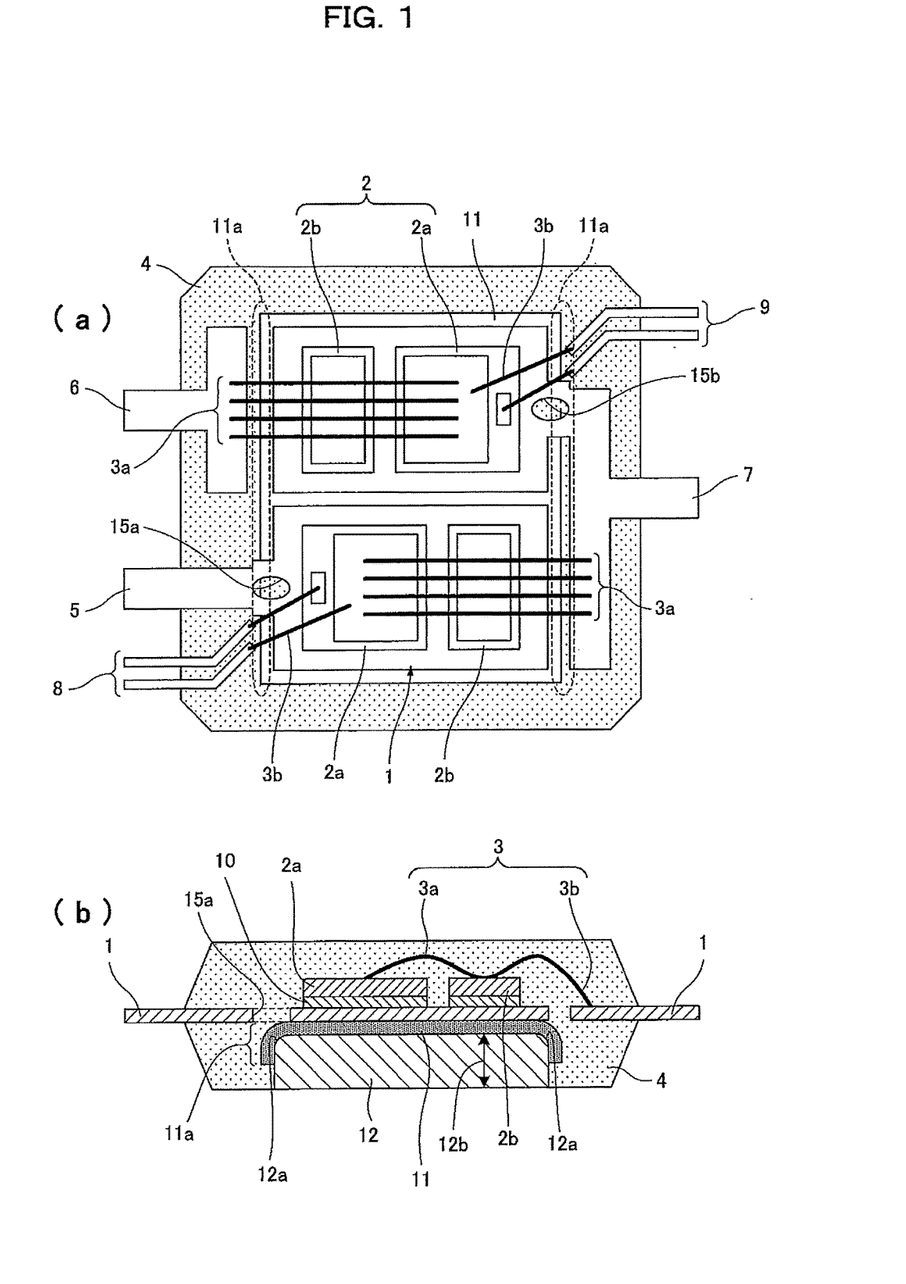
FIG. 1(a) is an internal plan view showing a semiconductor device according to a first embodiment of the present invention and FIG. 1(b) is an internal cross-sectional view showing the semiconductor device.

FIGS. 1(*a*) and 1(*b*) illustrate the two positive-side control terminals 8 and the two negative-side control terminals 9. The number of terminals is not limited and may be changed depending on the function of the power semiconductor element 2.

Figure 2:
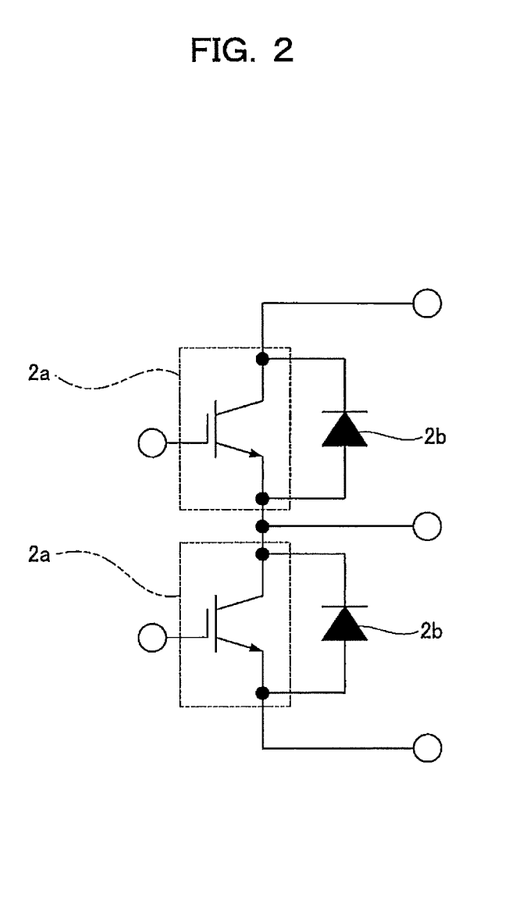
FIG. 2 is an electric circuit diagram showing the semiconductor device according to the first embodiment of the present invention.

FIG. 2 is an electric circuit diagram of the illustrated structure according to the first embodiment of the present invention. Two pairs of the IGBTs 2a and FWDs 2b are connected in series. The electric circuit diagram in FIG. 2 illustrates an inverter of one arm. The FWDs 2b are connected in anti-parallel so as to allow a reverse recovery current generated by an overvoltage during switching of the IGBTs 2a to pass through the FWDs 2b, thereby preventing the IGBTs 2a from being broken. For example, an inverter circuit for a three-phase alternating current can be formed by combining three semiconductor devices with such a circuit configuration. The inverter circuit can be used for, for example, controlling the rotation of a motor.

Subsequently, the curved areas 11a of the insulating layer 11 are disposed so as to face the predetermined two sides in the semiconductor device of the first embodiment. A reduction in the possibility of a dielectric breakdown caused by this configuration will be described below.

Heat generated from the IGBT 2a is sequentially transmitted to the bonding material 10, the lead frame 1, the insulating layer 11, and the heat-dissipating plate 12 and then is dissipated to the outside from the surface of the heat-dissipating plate 12 exposed from the molding resin 4.

As shown in FIG. 1(*b*), the curved area 11a constituting a part of the insulating layer 11 of the first embodiment is curved downward (to the heat-dissipating plate 12) along a side of the heat-dissipating plate 12. In the semiconductor device of the first embodiment, in this way, an edge 12a of the heat-dissipating plate 12 is covered with the insulating layer 11. Thus, even if an air layer (void) is generated during injection of the molding resin 4, the insulating layer 11 provided in addition to the air layer between the lead frame 1 and the edge 12a of the heat-dissipating plate 12 does not easily generate a dielectric breakdown. In this configuration, the edge 12a of the heat-dissipating plate 12 is a corner near the insulating layer 11 on the heat-dissipating plate 12.

The distance of the curved area 11a extended from a curved point to the heat-dissipating plate 12 depends on a thickness 12b of the heat-dissipating plate 12. The distance is desirably determined such that the end of the insulating layer 11 is not exposed from the molding resin 4. Specifically, the end of the insulating layer 11 having the curved area 11a according to the first embodiment is located in the molding resin 4. This is because if the end of the insulating layer 11 is exposed to the outside, moisture may penetrate from the insulating layer 11 and the absorption of moisture may deteriorate the dielectric voltage of the insulating layer 11. Hence, according to the experiments of the inventors, the curved area 11a is preferably extended to the first surface of the heat-dissipating plate 12 by, for example, a distance equivalent to a half to two thirds of the thickness 12b of the heat-dissipating plate 12. Specifically, if the heat-dissipating plate 12 has a thickness of 2 mm, the curved area 11a is extended to the heat-dissipating plate 12 by, for example, 1 mm to 1.3 mm. Furthermore, in the first embodiment, the curved area 11a is in contact with the side of the heat-dissipating plate 12. This configuration reduces the possibility of connection between the lead frame 1 and the heat-dissipating plate 12 via a spherical air layer.

Moreover, in the first embodiment, the predetermined two side edges 12a of the heat-dissipating plate 12 have rounded shapes (tapered round shapes) as shown in FIG. 1(*b*). The predetermined two side edges 12a of the heat-dissipating plate 12 are illustrated as the two right and left sides near the lead frame 1 in FIG. 1(*a*). The rounded shape of the heat-dissipating plate 12 is formed by, for example, press working using molds. If the heat-dissipating plate 12 is made of Cu and the thickness 12b is 2 mm, the rounded shape of about 0.1 mm is formed. In this case, a clearance between a die and a punch in press working is set at about 5% of the thickness 12b of the heat-dissipating plate 12. The rounded shape of the heat-dissipating plate 12 formed thus is brought into contact with the insulating layer 11, thereby easily curving the insulating layer 11 having low flexibility.

Figure 3:
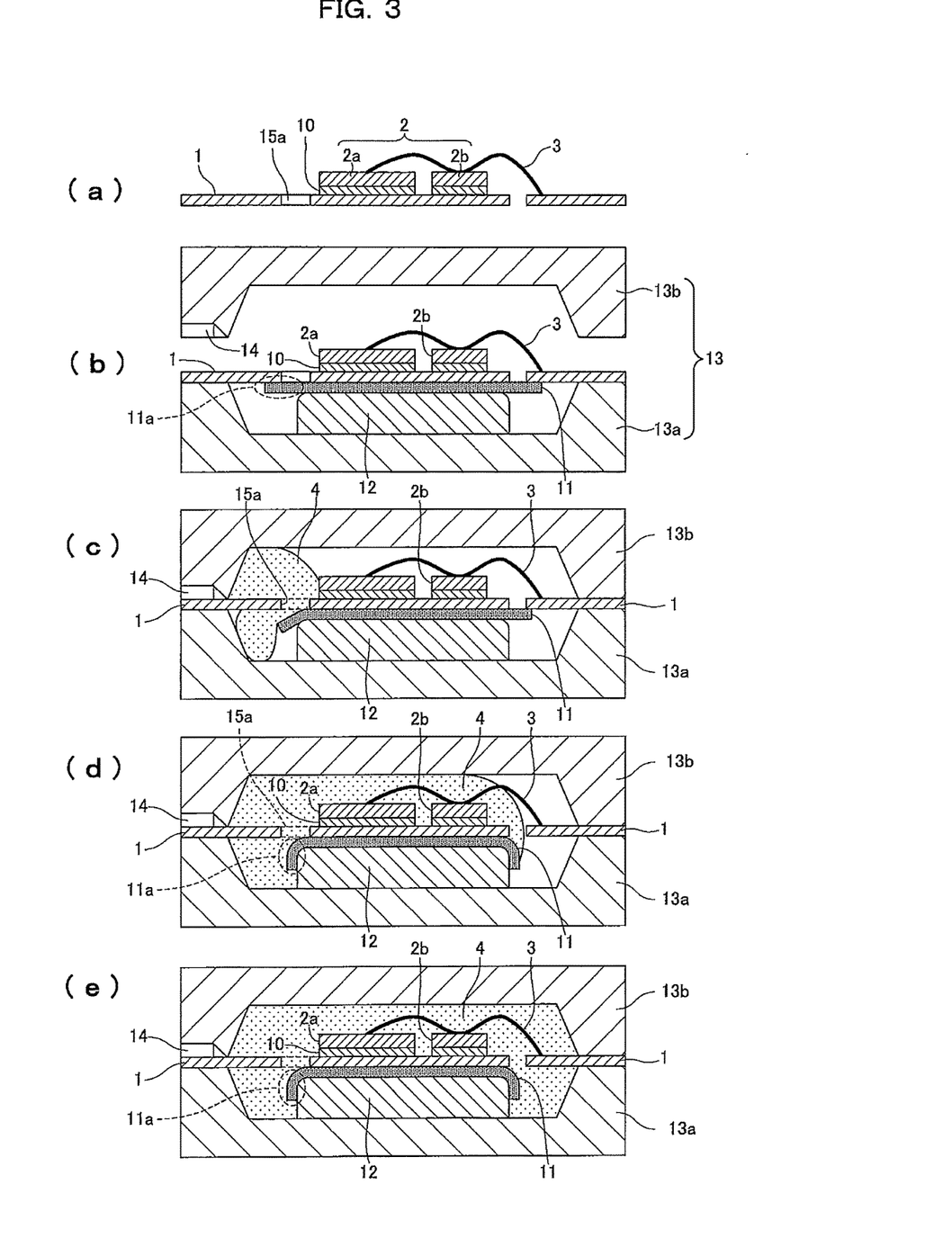
FIGS. 3(a) to 3(e) are schematic diagrams showing the manufacturing process of the semiconductor device according to the first embodiment of the present invention.

FIGS. 3(*a*) to 3(*e*) show the manufacturing process of the semiconductor device.

In FIG. 3(*a*), a die bonding step is performed to mount the power semiconductor element 2 on the lead frame 1, and then a wire bonding step is performed to connect the power semiconductor element 2 and the lead frame 1 via the bonding wires 3. In FIG. 3(*b*), the heat-dissipating plate 12 with the bonded insulating layer 11 and the lead frame 1 are mounted in a molding die 13. FIGS. 3(*c*) and 3(*d*) show the molding resin 4 being injected in a molding step. In FIG. 3(*e*), the injection of the molding resin 4 is completed. In this configuration, the molding die 13 includes a drag 13a and a cope 13b.

As has been discussed, the insulating layer 11 of the first embodiment is mainly composed of an epoxy resin and thus has the lowest heat conductivity in a heat-dissipating path from the power semiconductor element 2 of the semiconductor device. For this reason, in the first embodiment, the insulating layer 11 contains a high concentration of a ceramic filler to improve heat conduction. The ceramic filler is, for example, alumina ($Al_2O_3$) or a BN filler.

In this case, the insulating layer 11 containing a high concentration of the ceramic filler is less flexible than an epoxy resin alone. For this reason, if the insulating layer 11 is curved beforehand, the insulating layer 11 may be broken. Through various experiments, the inventors have found a manufacturing method that can curve the insulating layer 11 containing a high concentration of the ceramic filler without another step. In this manufacturing method, the shape of the insulating layer 11 is changed and curved while being softened according to a mold temperature determined by heat from the mold used in the molding step and a stress determined by a flow of molding resin in transfer molding. In this case, the mold temperature is 170° C. to 180° C., which can soften the molding resin 4 into a liquid state before a cure reaction.

As shown in FIGS. 3(*b*), 3(*c*), and 3(*d*), the curved area 11a of the insulating layer 11 extends beyond the heat-dissipating plate 12 and is not supported by the heat-dissipating plate 12 from below. Thus, the curved area 11a is deformed (curved) by a stress generated by the dead weight of the molding resin 4 that flows from the top surface while being softened according to the mold temperature. In the first embodiment, the dead weight of the molding resin 4 is used in this way, curving the curved area 11a of the insulating layer 11 in the thickness direction of the heat-dissipating plate 12 without another step.

FIGS. 3(a) to 3(e) are explanatory drawings of the curving step of the curved area 11a during molding. If the number of steps can be increased without any problems, the curved area 11a of the insulating layer 11 may be curved before being mounted in the molding die 13.

The manufacturing process of the semiconductor device in FIGS. 3(a) to 3(e) will be specifically described below.

The state of FIG. 3(a) includes the die bonding step and the wire bonding step.

In the die bonding step, the IGBT 2a and the FWD 2b are bonded to the lead frame 1 with the bonding material 10. In this case, if the bonding material 10 is Sn—Ag—Cu solder, the formation of Ag plating at a bonding position on the lead frame 1 improves wettability at the bonding position so as to contribute to a smaller void in the solder. Thus, this configuration is preferable in terms of reliability and heat dissipation. In the first embodiment, the power semiconductor element 2 is mounted when the lead frame 1 is preheated to at least 260° C. to melt the bonding material 10. Since solder in the atmosphere is immediately oxidized so as to reduce wettability, the power semiconductor element 2 is preferably mounted in a reduced atmosphere.

In the wire bonding step, the IGBT 2a, the FWD 2b, and the lead frame 1 are electrically connected via the bonding wires 3. The bonding wires 3 are connected by, for example, heat bonding or ultrasonic bonding. In this case, the bonding wires 3 that are aluminum wires can be bonded to the lead frame 1 made of Cu but the oxidation of Cu may cause insufficient process stability or reliability. Thus, the lead frame is desirably plated with Ni beforehand. Like Al, Ni plating forms a solid and thin oxide film in a passive state and thus the state is not changed by heating. Moreover, the passive state is relatively easily disturbed by ultrasonic vibrations so as to easily expose a newly formed surface, achieving an excellent bonding property.

Without any problems, the bonding wires 3 connecting the IGBT 2a and the lead frame 1 may be identical to the bonding wires 3 used for connecting the IGBT 2a, the FWD 2b, and the lead frame 1. In this case, one step can be reduced so as to preferably reduce a lead time.

In FIG. 3(b), the molding die 13 contains a laminated body of the heat-dissipating plate 12 and the insulating layer 11 and the lead frame 1 formed through the die bonding step and the wire bonding step. At this point, the area of the insulating layer 11 is set larger than that of the heat-dissipating plate 12 such that the insulating layer 11 includes the curved area 11a. For example, in order to set the width of the curved area 11a at 1 mm relative to the heat-dissipating plate 12 having a side of 20 mm and a thickness of 2 mm, two opposing sides of the insulating layer 11 are preferably 22 mm in length while the other two sides of the insulating layer 11 are preferably 20 mm in length. In this case, the heat-dissipating plate 12 and the insulating layer 11 are temporarily bonded to each other without a cure reaction. The heat-dissipating plate 12 and the insulating layer 11 are bonded to each other at, for example, a temperature of 80° C. and a pressure of about 1 MPa so as to be temporarily bonded without being peeled off.

In FIG. 3(c), the drag 13a and the cope 13b are closed to clamp the lead frame 1 and then the molding resin 4 is injected into the drag 13a and the cope 13b. In the first embodiment, a runner 14 that is a passage of the molding resin 4 is formed in the cope 13b, allowing the molding resin 4 flowing into the molding die 13 to first pass through the upper side (cope 13b) of the lead frame 1. In the semiconductor device such as a power module including the heat-dissipating plate 12, in particular, the presence of the heat-dissipating plate 12 delays the injection of the molding resin 4 into the lower side (drag 13a) of the lead frame 1. This tendency can be accelerated by the runner 14 disposed on the cope 13b. In this case, the insulating layer 11 is softened by heat from the molding die 13 and thus is deformed with a pressed applied from above if the molding resin 4 flows from the above of the lead frame 1. Hence, as shown in FIG. 3(c), the curved area 11a of the insulating layer 11 is curved downward along the side (rounded) of the heat-dissipating plate 12.

In the first embodiment, as shown in FIG. 1(a), the hole 15a is formed on the proximal end of the positive-side power terminal 5. Thus, the molding resin 4 from the runner 14 also flows directly under the proximal end of the positive-side power terminal 5 from the hole 15a so as to curve the insulating layer 11 downward. If a small amount of the molding resin 4 flows directly under the positive-side power terminal 5, the curved area 11a may be insufficiently curved downward so as to break the insulating layer 11 almost directly under the proximal end of the positive-side power terminal 5. However, the hole 15a formed on the proximal end of the positive-side power terminal 5 allows the molding resin 4 to flow also directly under the proximal end of the positive-side power terminal 5. Thus, the curved area 11a can be evenly curved downward.

The molding resin 4 similarly flows on the proximal end of the output-side power terminal 7. In the first embodiment, as shown in FIG. 1(a), the hole 15b is formed on the proximal end of the output-side power terminal 7. Thus, the molding resin 4 also flows directly under the proximal end of the output-side power terminal 7 from the hole 15b so as to evenly curve the curved area 11a downward.

In FIG. 3(e), the molding resin 4 is injected over the cavity of the molding die 13. In the state of FIG. 3(e), a pressure is applied to the insulating layer 11 from a plunger that injects the molding resin 4 through the runner 14. The pressure and heat from the molding die 13 start a reaction of the insulating layer 11, obtaining insulation and heat dissipation.

After that, an unnecessary part of the lead frame 1 protruding from the molding resin 4 is cut or worked. The lead frame 1 used as a protruding terminal is plated with, for example, Sn if necessary. The semiconductor device can be manufactured in these steps.

In the manufactured semiconductor device, the molding resin 4 in the runner 14 is unnecessary and thus is removed. Thus, a cutting mark is inevitably left on a part corresponding to the runner 14 in the semiconductor device when the molding resin 4 is removed. Specifically, in the semiconductor device according to the first embodiment, the molding resin 4 has a cutting mark on the opposite side of the lead frame 1 from the insulating layer 11 and the heat-dissipating plate 12.

As has been discussed, the semiconductor device according to the first embodiment can be manufactured such that the edge 12a of the heat-dissipating plate 12 is covered with the insulating layer 11 without an additional step. Thus, the semiconductor device of the first embodiment can remarkably suppress a reduction in dielectric voltage. The dielectric voltage is reduced by the presence of an air layer such as a void.

In the semiconductor device according to the first embodiment, the curved area 11a corresponds to an insulation distance. Thus, as has been discussed, a dielectric voltage of about 3 KV can be effectively obtained as a property of air if the curved area 11a is, for example, 1 mm in length. The provision of the curved area 11a can obtain a dielectric voltage even if the molding resin 4 peeled from the heat-dissipating plate 12 and the insulating layer 11 connects the lead frame 1 and the heat-dissipating plate 12 via an air layer except for a void.

Second Embodiment

Figure 4:
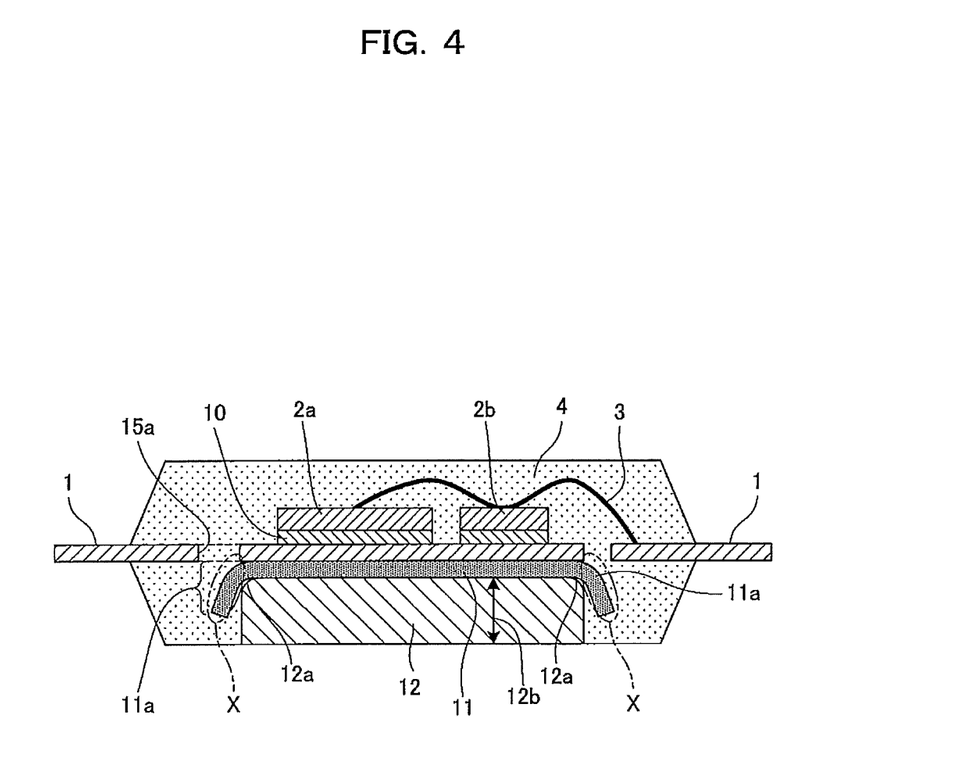
FIG. 4 is an internal cross-sectional view showing a semiconductor device according to a second embodiment of the present invention.

FIG. 4 is an internal cross-sectional view showing a semiconductor device according to a second embodiment of the present invention.

The second embodiment is different from the first embodiment in that a curved area 11a of an insulating layer 11 has a portion X that is not in contact with a side of a heat-dissipating plate 12. In the second embodiment, the curved area 11a of the insulating layer 11 is curved by the dead weight of molding resin 4 and thus the portion X of the curved area 11a is located farther from the side of the heat-dissipating plate 12 as the portion X approaches a surface where the heat-dissipating plate 12 is exposed from the molding resin 4 (an undersurface in FIG. 4).

Unlike in the case where the insulating layer 11 and the heat-dissipating plate 12 are completely in contact with each other, this configuration can obtain, as indicated by a broken line X in FIG. 4, an insulation distance corresponding to a distance of separation from the side of the heat-dissipating plate 12. For example, the curved area 11a having a length of 1 mm effectively increases a dielectric voltage by about 3 KV.

Such a configuration can be manufactured by adjusting the property of the molding resin 4. The specific gravity of the molding resin 4 is changed according to the content of a silica filler that is a main component. Thus, the semiconductor device configured according to the second embodiment can be manufactured by setting the specific gravity of the molding resin 4 smaller than in the first embodiment. If the content of the silica filler is changed by 5% as a percent by weight, the value of the specific gravity is changed according to the content of the silica filler by, as a guide, 10%, which is not uniform because the specific gravity also depends on the kind of an epoxy resin.

INDUSTRIAL APPLICABILITY

The present invention can suppress a deterioration of the dielectric voltage of a semiconductor device in, for example, a transfer mold power module without unnecessarily expanding a heat-dissipating plate.

REFERENCE SIGNS LIST 1 lead frame
2 power semiconductor element
2a IGBT
2b FWD
3, 3a, 3b bonding wire
4 molding resin
5 positive-side power terminal
6 negative-side power terminal
7 output-side power terminal
8 positive-side control terminal
9 negative-side control terminal
10 bonding material
11 insulating layer
11a curved area
12 heat-dissipating plate
12a edge
12b thickness
13 molding die
13a drag
13b cope
14 runner
15a, 15b hole

The invention claimed is:

1. A semiconductor device comprising:
a first substrate on which a semiconductor element is mounted;
a heat-dissipating plate;
an insulating layer disposed between the first substrate and the heat-dissipating plate; and
molding resin that molds the first substrate, the heat-dissipating plate, and the insulating layer,
the heat-dissipating plate having a first surface opposite to the insulating layer, the first surface being exposed from the molding resin,
the insulating layer having at least two curved areas that are curved to the first surface and at least two ends that are located in the molding resin,
the heat-dissipating plate being rectangular,
the two curved areas of the insulating layer facing two predetermined sides of four sides of the heat-dissipating plate and the insulating layer over-hangs two predetermined sides of four sides of the heat-dissipating plate.

2. The semiconductor device according to claim 1, wherein the curved area of the insulating layer has a shorter length than a thickness of the heat-dissipating plate.

3. The semiconductor device according to claim 2, wherein the length of the curved area of the insulating layer is a half to two thirds of the thickness of the heat-dissipating plate.

4. The semiconductor device according to claim 1, wherein the heat-dissipating plate has a rounded edge near the insulating layer in contact with the heat-dissipating plate.

5. The semiconductor device according to claim 1, wherein the heat-dissipating plate has a rounded edge near the curved area of the insulating layer in contact with the heat-dissipating plate, the curved area being formed on each of predetermined two sides out of four sides of the insulating layer.

6. The semiconductor device according to claim 1, wherein the curved area of the insulating layer is in contact with a side of the heat-dissipating plate.

7. The semiconductor device according to claim 1, wherein the curved area of the insulating layer is located farther from a side of the heat-dissipating plate as the curved area approaches the first surface.

8. The semiconductor device according to claim 1, wherein the molding resin has a cutting mark on an opposite side of the first substrate from the heat-dissipating plate.

9. The semiconductor device according to claim 1, wherein the insulating layer is made of a material that is softened at an injection temperature of the molding resin.

10. The semiconductor device according to claim 1, wherein the insulating layer is made of a material that is softened at a mold temperature of a mold used during molding of the molding resin.

* * * * *